United States Patent [19]

Stickney

[11] Patent Number: 5,029,254
[45] Date of Patent: Jul. 2, 1991

[54] CLIP MOUNTED ELECTROMAGNETIC SHIELDING DEVICE

[75] Inventor: William H. Stickney, Cresco, Pa.

[73] Assignee: Instrument Specialties Company, Inc., Delaware Water Gap, Pa.

[21] Appl. No.: 497,619

[22] Filed: Mar. 23, 1990

[51] Int. Cl.⁵ .............................................. H05K 9/00
[52] U.S. Cl. ............................ 174/35 GC; 174/35 R; 29/592.1
[58] Field of Search .......... 174/35 GC, 35 R, 35 MS; 361/424; 219/10.55 D, 10.55 R; 29/592.1

[56] References Cited

U.S. PATENT DOCUMENTS

| | | |
|---|---|---|
| 3,504,095 | 1/1968 | Roberson et al. . |
| 3,555,168 | 1/1971 | Frykberg . |
| 3,904,810 | 9/1975 | Kraus . |
| 4,623,752 | 11/1986 | Steen et al. ................ 174/35 GC |
| 4,652,695 | 3/1987 | Busby . |
| 4,742,201 | 5/1988 | Nakano et al. . |
| 4,760,214 | 7/1988 | Bienia et al. . |
| 4,762,966 | 8/1988 | Kosanda . |
| 4,803,306 | 2/1989 | Malmquist . |

FOREIGN PATENT DOCUMENTS 2184294 6/1987 United Kingdom .......... 174/35 GC

OTHER PUBLICATIONS

Nuccio et al., Conductive Seal for Electromagnetic Shielding, IBM Technical Disclosure Bulletin, vol. 20, No. 1, p. 281, (6/77).
Pawling Corporation, Performance Proven EMI/RFI Shielding, Circle Reader Service #65.

Primary Examiner—Leo P. Picard
Assistant Examiner—Bot Lee Ledynh
Attorney, Agent, or Firm—Burns, Doane, Swecker & Mathis

[57] ABSTRACT

An electromagnetic shielding device for use along gaps between relatively movable surfaces of doors, access panels, drawers, and cabinets, etc., includes an electrically conductive shielding strip and a clamping element. The shielding device also includes a mechanism that secures the shielding strip to the clamping element when the shielding device is not mounted on a surface. When mounted on a surface, the shielding strip is held in position by the clamping element. The shielding strip is formed so as to avoid being exposed to excessive stress.

16 Claims, 6 Drawing Sheets

CLIP MOUNTED ELECTROMAGNETIC SHIELDING DEVICE

FIELD OF THE INVENTION

The present invention relates generally to electronic shielding devices and more particularly to electromagnetic shielding devices adapted for mounting on a surface by a clip.

BACKGROUND OF THE INVENTION

Electromagnetic shielding is provided at joints between removable panels of housings for electronic equipment and testing facilities to impede transmission of electromagnetic fields. Optimally, electromagnetic activity from external devices is prevented from effecting the shielded device while electromagnetic activity generated by the shielded device itself is also prevented from escaping the shielded enclosure. Electromagnetic shielding is often required for shielded enclosures such as, for example, doors of electronic laboratory rooms, casings of radio transmitters, receivers and computers and other similar facilities and equipment.

Commonly, such structures and equipment require shielding along gaps between surfaces of doors, access panels, drawers, cabinets or the like, where surfaces are repeatedly, or only possibly, moved relative to one another. For example, electrical components may be arranged individually in cases which are slid into and out of cabinets every time there arises a need to test, service or update the component. Accordingly, it is highly desirable for the casing to have electromagnetic shielding that is adapted to withstand the bi-directional shearing action induced upon it by each insertion and a removal of the casing into and from the cabinet. Similarly, electrical components may be arranged in a compartment accessible only through a pivoting door which must be opened and closed each time there arises a need to test, service or update the component. As with the casings, it is highly desirable for the mating surfaces of the door to have electromagnetic shielding that is adapted to withstand the "wiping" action induced thereon during each pivot of the door. Failing such characteristics, the electromagnetic shielding of the electrical component may become broken and the component along with the entire electrical system to which it is connected become vulnerable to or an emitter of electromagnetic interference.

Track mounted electromagnetic shielding devices such as that disclosed in U.S. Pat. No. 4,623,752 issued to Steen et al. have been previously proposed to provide acceptable electromagnetic shielding. However, track-mounted devices are not readily mountable or removable for repair or replacement since at least one part of such devices, namely the track, is separately secured to the surface by separate fasteners. Furthermore, the fastener receiving holes disposed in the track may also compromise the overall shielding effectiveness of the shielding device. For example, the carrier strip used in the Steen et al. device is mounted to a surface by separate push-in rivets and before the Steen et al. device can be fully mounted and assembled, the carrier strip must first be secured to the surface by the push-in rivets. Similarly, if the device needs to be replaced or repaired, the rivets must first be removed before the carrier strip can be removed. The extra step of having to insert or remove the rivet before the shielding device may be mounted or removed is an inconvenient step of the mounting or removal procedure. Moreover, the presence of holes for receiving the rivets is likely to reduce the overall shielding effectiveness of the Steen et al. device.

To avoid such inconveniences associated with track mounted devices while still providing acceptable electromagnetic shielding, it has been proposed to secure a shielding strip to a surface with a retaining clip. For example, in U.S. Pat. No. 4,760,214 granted to Bienia et al., an electromagnetic shielding device is disclosed having a clamping element that secures a shielding strip to a surface. The clamping element does not require a separate fastener in order to secure the clip to the mounting surface and, consequently, the shielding device may be readily mounted or removed without extensive assembly or disassembly steps.

Notable of clip mounted devices such as that disclosed in the Bienia et al. reference, however, is that the clamping element and the shielding element are only secured to each other when mounted on a surface. Consequently, when removed from the surface or prior to mounting on the surface, the clamping element and the shielding element become separated and thus each element is susceptible to becoming lost. Moreover, during the mounting procedure, care must be taken to ensure that the clamping element is situated correctly with respect to the shielding element and vice versa. Such added care causes the mounting procedure to become rather tedious.

Clip mounted devices such as that disclosed in the Bienia et al. patent may also experience undesirable stresses within the shielding element. Depending on how the shielding element is secured within the clamping element, concentrated stresses may be cyclically induced at certain locations on the shielding element. Such undesirable stresses may result in catastrophic failure of the shielding strip that would disrupt the integrity of the electromagnetic seal around the shielded item.

OBJECTS AND SUMMARY OF THE INVENTION

It is an object of the present invention to provide an electromagnetic shielding device that overcomes the problems associated with the prior art.

Another object of the present invention is to provide an electromagnetic shielding device which remains assembled when not mounted.

Another object of the present invention is to provide an electromagnetic shielding device capable of being retained to a surface with a high retention force, and exhibiting a low compression force.

Another object of the present invention is to provide an electromagnetic shielding device that may be mounted to a surface without an adhesive or separate fasteners.

Another object of the present invention is to provide an electromagnetic shielding device useful over a wide range of surface thicknesses.

These and other objects are accomplished by an electromagnetic shielding device in accordance with the present invention which includes an electrically conductive shielding strip having a plurality of longitudinally arranged segments integrally connected to a carrier strip. The shielding device also includes a means for clamping the shielding strip to a surface of a member intended for shielding and a means for securing the shielding strip to the means for clamping when the shielding device is unmounted on the surface.

The means for securing the shielding strip to the means for clamping when the shielding device is unmounted may include a flexible tab disposed on each of the segments of the shielding strip. The means for securing may also include a retention receptacle disposed on the seams for clamping that serves to engage an end portion of the flexible tab. The retention receptacle may be a slot or a lower corner of the clamping means, each of which may serve to receive a corner projection of the flexible tab.

In order to secure the shielding strip to the means for clamping, the flexible tab of the means for securing may be formed to extend in an upward direction at an angle from a tongue portion of each segment. However, the flexible tab may also be formed to extend in a downward direction at an angle from a tongue portion of each segment.

The retention receptacle of the means for securing may be a slot or a corner of the means for clamping. The means for securing may alternatively include a finger portion of each of the segments wherein the finger portion may be attached to the means for clamping by spot welding or through the use of an adhesive.

BRIEF DESCRIPTION OF THE DRAWINGS

Many other objects and advantages of the present invention will be apparent to those skilled in the art from this specification and attached drawings. The preferred embodiments of the present invention will be described in greater detail with reference to the accompanying drawings, wherein like elements bear like reference numerals and wherein.

DETAILED DESCRIPTION OF THE PREFERRED EMBODIMENTS

Figure 1:
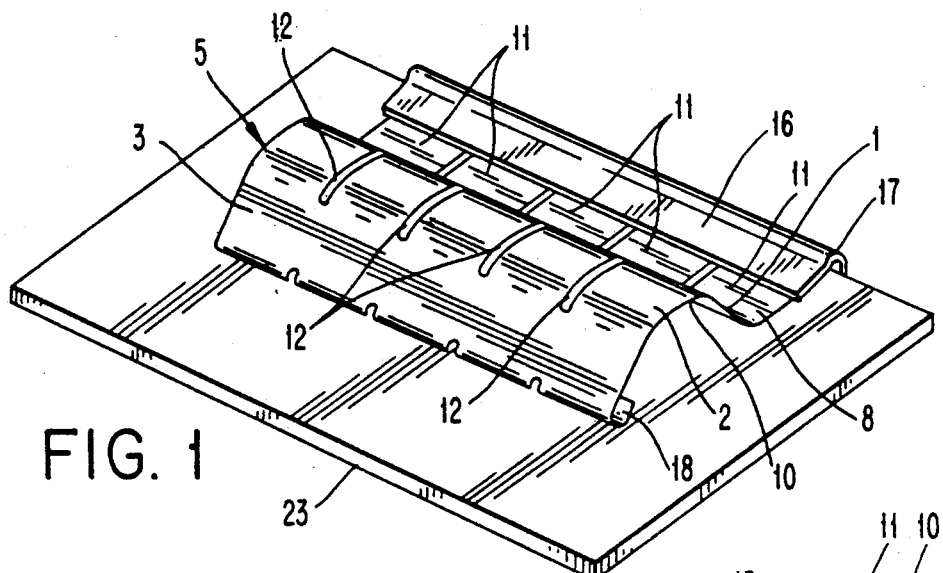
FIG. 1 is a perspective view an electromagnetic shielding device in accordance with a first embodiment of the present invention.

An electromagnetic shielding device 5 in accordance with the present invention is mounted on a surface 23 (See FIG. 1). The electromagnetic shielding device 5 includes a shielding strip 10 that is secured to the surface 23 by a retention clip 16. The surface 23 is representative of an edge of an electrical compartment that mates with an opposing surface when the compartment is closed.

Figure 2:
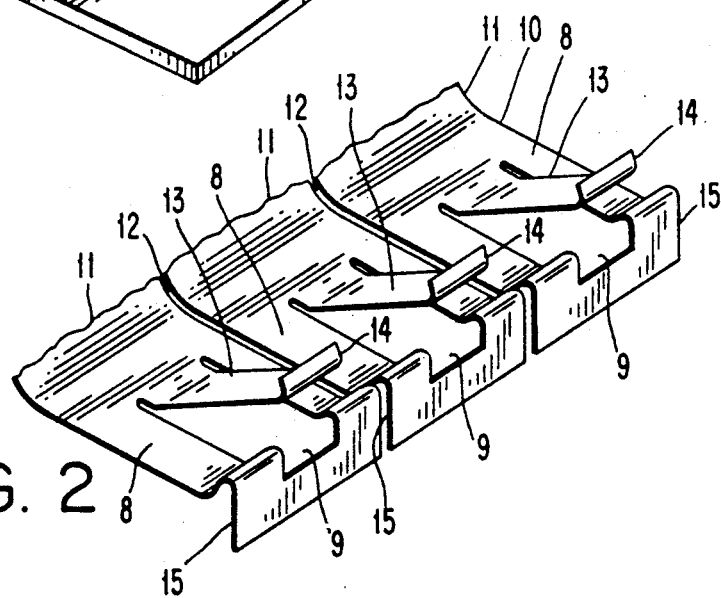
FIG. 2 is a perspective view of a portion of a shielding strip of a first embodiment of the present invention in a position more clearly showing a flexible tab on the shielding strip.

The shielding strip 10 includes a plurality of fingers that extend from a longitudinal carrier strip 3. Each finger 11 is separated from an adjacent finger 11 by a space 12 to provide flexibility to the shielding strip. Each finger 11 is formed to include a domed segment 2, a transition segment 1 and a tongue portion 8. Extending at an angle from a central region of the tongue portion 8 is a flexible tab 13 that is useful for retaining the shielding strip in the retention clip 16 (See FIG. 2). The tongue portion 8 also includes a rectangular opening 9 for receiving the flexible tab 13 when the flexible tab 13 is urged downwardly.

Figure 3:
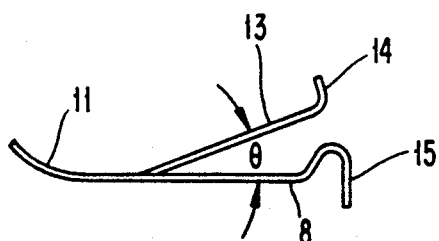
FIG. 3 shows a side view of the shielding strip of FIG. 2.

The flexible tab 13 is oriented upwardly at an angle $\theta$ from the tongue portion 8 when in a free position (See FIG. 3). However, the flexible tab 3 is resiliently bendable to a smaller angle $\alpha$ when the shielding strip is inserted into the retaining clip 16 (See FIG. 4). To secure the shielding strip 10 in the clip 16, each flexible tab 13 is formed to include a corner projection 14 and each tongue portion 8 is formed to include a retaining corner 15.

Figure 4:
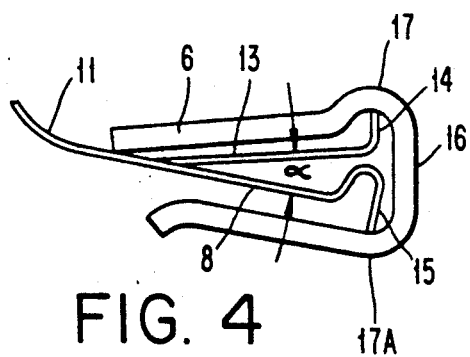
FIG. 4 is a side view of a portion of a shielding strip of a first embodiment of the present invention as positioned in a retention clip.

When properly inserted in the retention clip 16, the flexible tab 13 of the finger 11 is deflected downwardly relative to the tongue portion 8 to an angle $\alpha$ that is less than the free position angle $\theta$ (See FIG. 4). The biased condition of the flexible tab 13 relative to the tongue portion 8 causes the corner extension 14 of the flexible tab 13 to be urged into engagement with the retention receptacle 17 of the retention clip 16 while the retaining corner 15 of the tongue portion 8 is urged to a position in a lower corner 17A of the retention clip 16. The free position angle $\theta$ is chosen such that when each flexible tab 13 is engaged with the retention receptacle 17, the shielding strip is restrained by friction from longitudinal movement relative to the retention clip 16. In this assembled state, each finger 11 (and thus the shielding strip 10) is secured within the retention clip 16 despite not yet being mounted on a surface. Such an assembly avoids the problems associated with shielding devices that become disassembled when not mounted on a surface.

Figure 5:
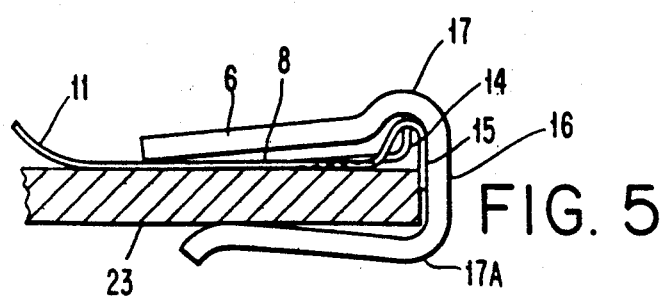
FIG. 5 is a side view of a portion of a shielding strip of a first embodiment of the present invention as mounted on a surface by a retention clip.

When mounted on a surface 23, the retention clip 16 and each finger 11 assume an orientation such that the surface 23 is positioned in contact with the retaining corner 15 of the tongue portion 8 (See FIG. 5). Additionally, due to the thickness of the surface 23, the tongue portion 8 is urged upwardly relative to the flexible tab 13 such that a rounded portion of the retaining corner 15 is received in the retention receptacle 17 of retention clip 16. In this manner, the electromagnetic shielding device 5 is secured to the surface 23. Since the device 5 is mounted via the clip 16, and does not require separate fasteners or adhesives, the devices are readily removable without undue labor.

Figure 6A:
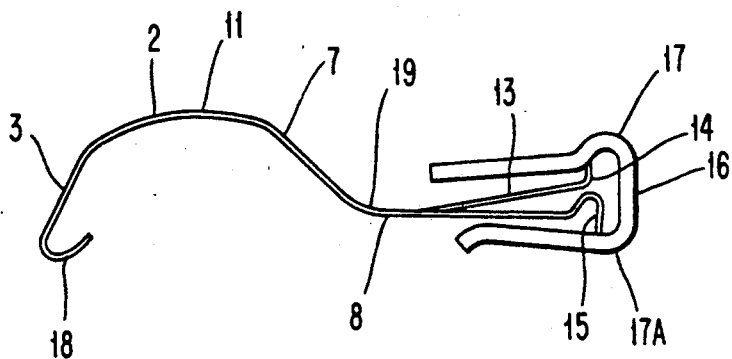
FIG. 6A is a cross-sectional side view of a first embodiment of an electromagnetic shielding device of the present invention in an unmounted condition.
Figure 6B:
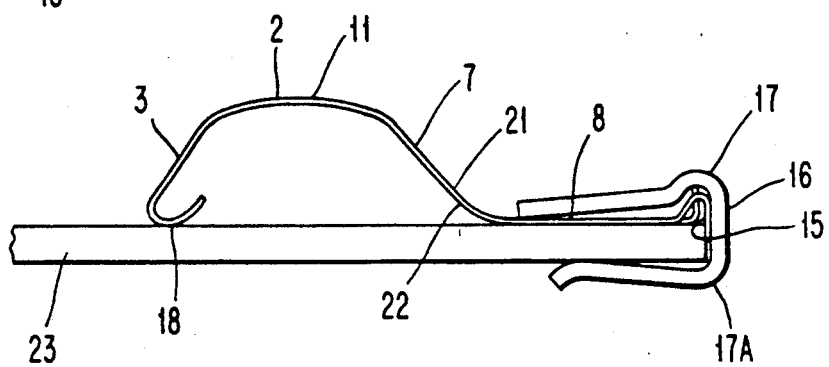
FIG. 6B is a cross-sectional side view of a first embodiment of an electromagnetic shielding device of the present invention in a pre-stressed condition as mounted on a surface.

When mounted and during use, a region of each finger 11 of the shielding strip 10 located between the transition portion 7 and the tongue portion 8 is subjected to various stresses as herein discussed with respect to FIGS. 6A-6D. In an unmounted but an assembled condition (See FIG. 6A), the region 19 located between the transition segment 7 and the tongue portion 8 of each finger 11 is unstressed. However, when the electromagnetic shielding device 5 is mounted on surface 23 (See FIG. 6B), a compressive stress is induced at a top surface region 21 of the finger 11 and a tensile stress is induced at a bottom surface region 22 of the finger 11. Both the top surface region 21 and the bottom surface region 22 are substantially located at the area where the transition segment 7 joins the finger portion 8 of the finger 11. The condition of the device as shown in FIG. 6B is termed the pre-stressed condition.

Figure 6C:
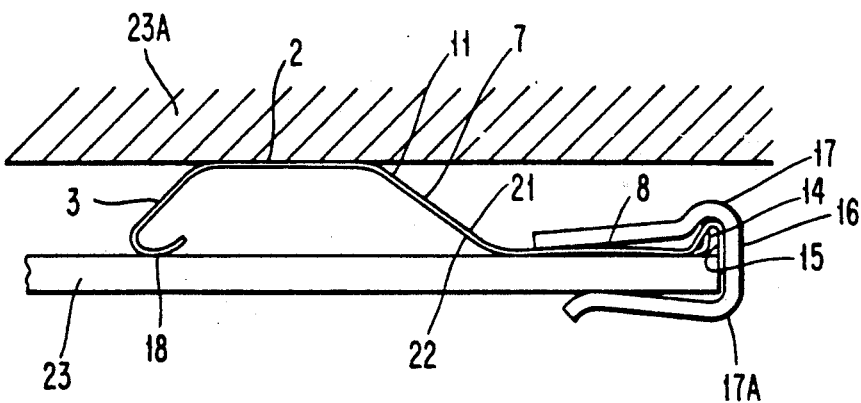
FIG. 6C is a cross-sectional side view of a first embodiment of an electromagnetic shielding device of the present invention as compressed to a working position between two mating surfaces.
Figure 6D:
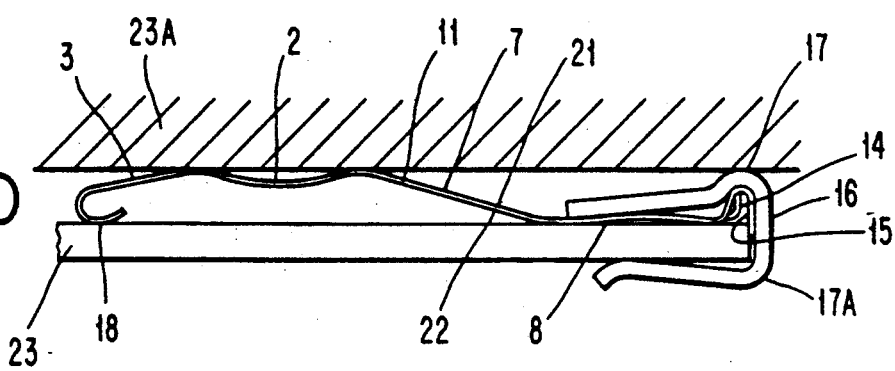
FIG. 6D is a cross-sectional side view of a first embodiment of an electromagnetic shielding device of the present invention in a maximum compression position between two mating surfaces.

When the finger 11 is compressed between the surface 23 and a mating surface 23A (See FIG. 6C), the transition segment 7 is deflected in a manner such that the compressive stress at the top surface region 21 and the tensile stress at the bottom surface region 22 are each substantially eliminated. Such a position of the device 5 as shown in FIG. 6C is termed the working position.

When each finger 11 is further compressed between surface 23 and mating surface 23A (See FIG. 6D), the transition segment is further deflected. Such position of further compression is termed the maximum compression position. Note that the mating surfaces 23A may compress the shielding strip 10 only to the extent that the mating surface 23A contacts the outer surface of the retention receptacle 17 of the retention clip 16. In the maximum compression position, a tensile stress is induced at the top surface region 21 and a compressive stress is induced at the bottom surface region 22.

Since the fingers 11 on the shielding strip are formed to achieve a zero-stress condition at the area joining transition segment 7 and the finger portion 8 when the fingers 11 are in the working position (See FIG. 6C), the ultimate stress induced at this area when the fingers assume the maximum compression position (See FIG. 6D) is less than if stress were already induced when the fingers were in the working position. That is, since the working position provides a finger 11 having a substantially zero stress level at the area joining the transition segment 7 and the finger portion, the total additive, or ultimate, stress at this area when the finger 11 is in a maximum compression position is reduced. Consequently, the fatigue life of each finger is increased. Increased fatigue life enhances the overall reliability of the device 5.

Figure 7:
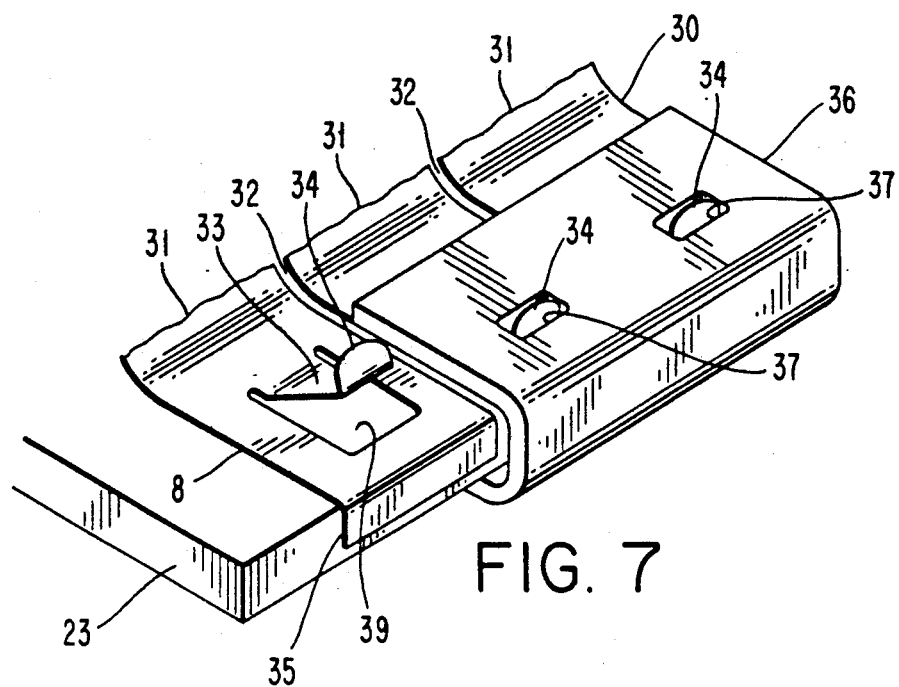
FIG. 7 is a perspective view of a second embodiment of the present invention having a segment of a shielding strip exposed for clearly showing a flexible tab.

A second embodiment of an electromagnetic shielding device in accordance with the present invention is shown to include a shielding strip 30 having a plurality of fingers 31, each of which is separated from an adjacent finger 31 by a space 32 to enhance shielding strip flexibility (See FIG. 7). As with the shielding strip of the first embodiment, each finger 31 includes a domed segment (not shown) and a transition segment (not shown) and a tongue portion 8. The shielding strip 30 is mounted on a surface 23 by a retention clip 36.

Figure 10:
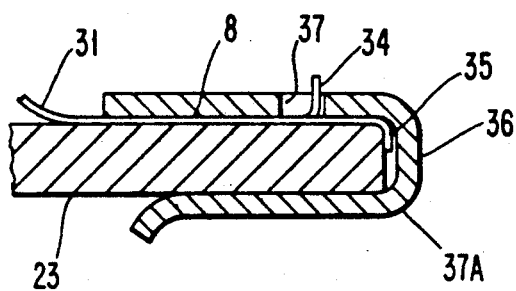
FIG. 10 is a side cross-sectional side view of a portion of a shielding strip of a second embodiment of the present invention as mounted on a surface by a retention clip.

Each finger 31 of the shielding strip 30 is formed such that, in a free position, a flexible tab 33 is at an angle $\theta$ upwardly from the tongue portion 8 (See FIG. 10). The flexible tab 33 includes a corner projection 34 and the tongue portion 8 includes a retaining corner 35 that are useful for securing the shielding strip 30 to the retention clip 36.

Figure 9:
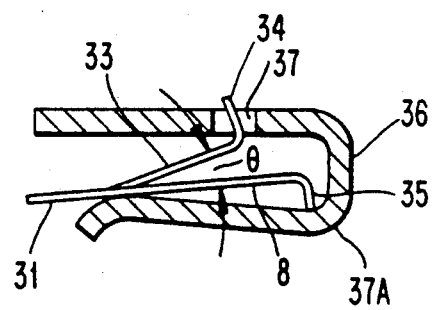
FIG. 9 is a cross-sectional side view of a portion of a shielding strip of a second embodiment of the present invention as positioned in a retention clip.

As secured in the retention clip 36, the corner projection 34 of each flexible tab 33 of each finger 31 is received in a corresponding retention slot 37 of the retention clip 36 (See FIG. 9). The retaining corner 35 of the finger portion 8 is received in a lower corner 37A of the retention clip 36. In order to position the corner projection 34 into the retention slot 37, the flexible tab 33 is initially compressed to an angle less than the free position angle $\theta$ until the finger 31 is sufficiently inserted into the clip 36. Once the corner projection 34 is positioned beneath the slot 37, the flexible tab 33 is released and the tab 33 returns to the free-position angle $\theta$. In this manner, the finger 31 is secured to the retention clip to form a single assembly despite not yet being mounted on the surface 23.

Figure 8:
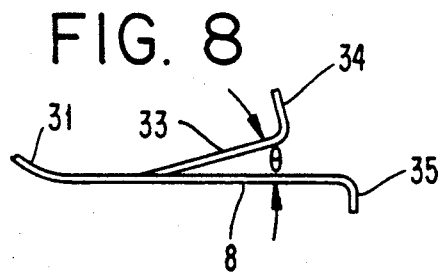
FIG. 8 is a side view of a portion of a shielding strip of a second embodiment of the present invention.

When sufficiently inserted, the surface 23 is in contact with the retaining corner 35 of the finger portion 8 (See FIG. 8). Additionally, the finger portion 8 is urged upwardly such that the flexible tab 33 and the finger portion 8 are located in substantially the same plane. In this manner, the electromagnetic shielding device is secured to the surface 23 and yet, since no separate fasteners are used, the device 5 is readily removable by simply removing the surface from the clip 36.

With regard to the first and second embodiments of the present invention, it is noted that the flexible tab 13 of the first embodiment and the flexible tab 33 of the second embodiment, are each deflected into substantially the same plane of the tongue portion 8 when the device is mounted on a surface 23. Consequently, bending stresses are induced at a tab stress region 24 where the flexible tab is joined to the finger 11 (See FIG. 11). The combination of the bending stresses induced at the region 24 along with bending stresses induced at other regions in close proximity to the region 24 due to the compression of the finger 11 between two opposing surfaces during use, may be undesirable. Such an undesirable stress combination is further discussed with respect to FIGS. 11-14.

Figure 11:
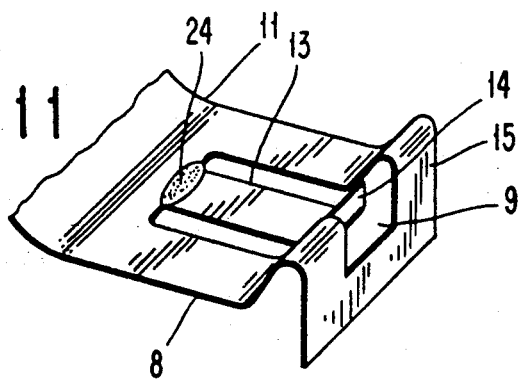
FIG. 11 is a perspective view of a segment of the shielding strip of FIG. 2 when mounted on a surface.

When the electromagnetic shielding device 5 is mounted on a surface 23, the flexible tab 13 is deflected into the opening 9 of the tongue portion 8 (See FIG. 11). In such a mounted condition, the flexible strip 13 is located in substantially the same plane as the tongue portion 8 and bending stresses are thus induced at a tab stress region 24 where the flexible tab 13 is attached to the finger 11.

Figure 12:
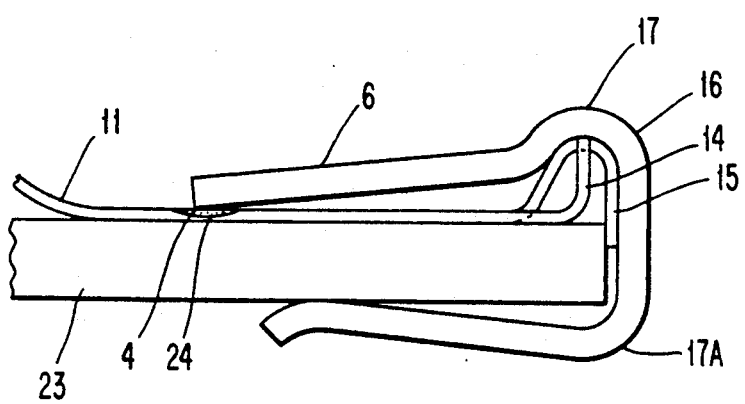
FIG. 12 indicates a stress condition of a portion of a shielding strip of a first embodiment of the present invention when mounted on a surface by a retention clip.
Figure 13:
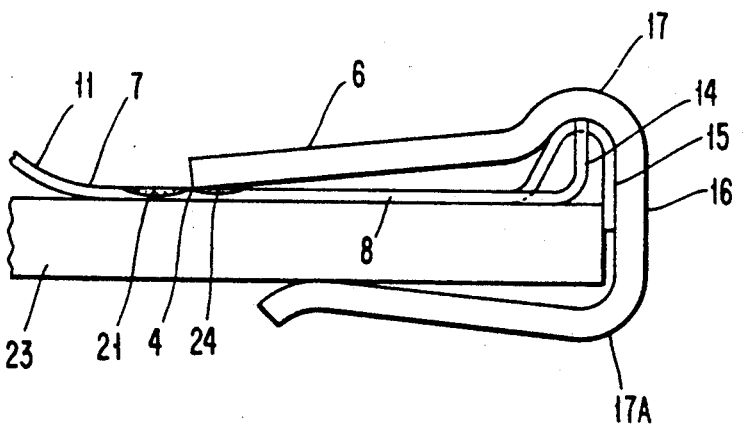
FIG. 13 indicates a stress condition of a portion of a shielding strip of a first embodiment of the present invention when mounted on a surface and compressed to a working position.

In particular, a tensile stress on a top side of the tab stress region 24 of the finger 11 is induced beneath an extension portion 6 of the retention clip 16 and rightwardly of a contact point 4 between the extension portion 6 and the finger 11 (See FIG. 12). As previously discussed, when the finger 11 is compressed beyond the working position to the maximum compression working position (See FIG. 6D), a tensile stress is induced at a top side region 21 between the transition segment 7 and the finger portion 8 of the finger 11. The tensile stress at the top-side region 21 is located to the left of the tab stress region 24 and leftwardly of the contact point 4 (See FIG. 13). Since, under normal use, the tab stress region 24 and the top surface stress region 21 are located adjacent to one another and do not overlap, the overall stress within the area of the transition segment 7 and the finger portion 8 is adequately distributed. However, if during use or due to improper mounting of the shielding device 5 to the surface 23, the tab stress region 24 and the top surface region 21 overlap, an undesirably high, single stress region 26 may be produced (See FIG. 14).

Figure 14:
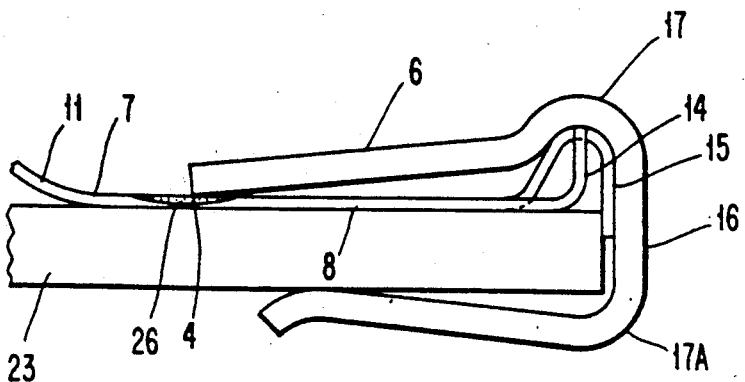
FIG. 14 indicates a stress condition of a portion of a shielding strip of a first embodiment of the present invention when mounted on a surface and compressed to a further compressed operating position.

For example, the retention clip 16 may fail to be properly placed over the finger 11 such that a gap may exist between the retaining corner 15 of the finger portion 8 and the inside wall of the retention clip 16 (See FIG. 14). Such a gap will allow the top surface region 21 that has a tensile stress when the finger 11 is in a working position to overlap the tab stress region 24 thus creating a single additive stress region 26. Such a single stress region 26 may not adequately distribute stresses over the area joining the transition segment 7 and the finger portion 8 and, consequently, may reduce the useful life of the tab 13 and/or finger 11 as a result of undue fatigue.

Figure 15:
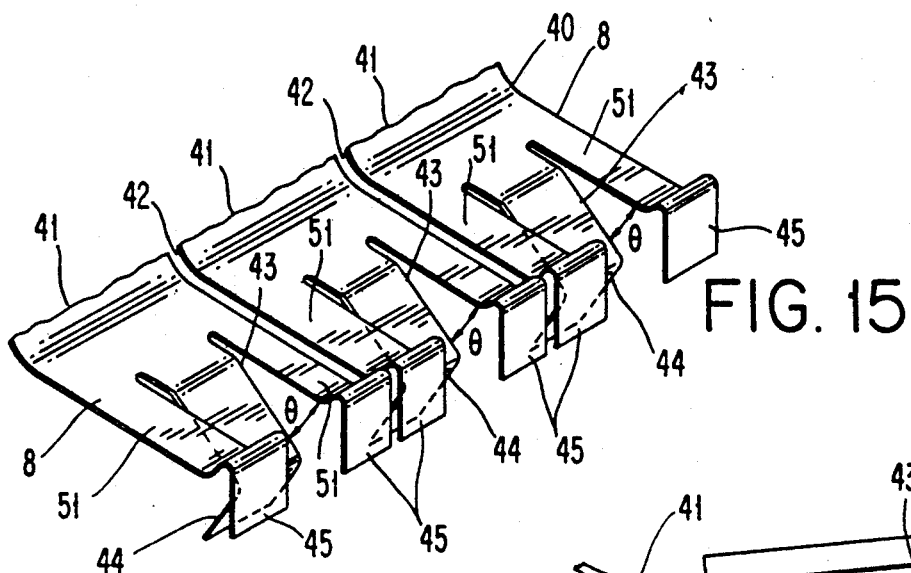
FIG. 15 is a perspective view of a portion of a shielding strip of a third embodiment of the present invention.

To reduce the likelihood of a single stress area 26 from arising, a third embodiment of the present invention is described (See FIG. 15). A shielding strip 40 has a plurality of fingers 41 each of which is separated by a space 42 to enhance shielding strip flexibility. As with the first and second embodiments, each finger 41 is formed to include a domed segment (not shown), a transition segment (not shown) and a tongue portion 8. Each tongue portion 8 includes two finger extensions 51 positioned on either side of a flexible tab 43 thus allowing the flexible tab 43 to be deflected therebetween. Each flexible tab 43 is angled downwardly from each finger extension 51 by an angle $\theta$ when in a free position. Additionally, each flexible tab 43 includes a corner projection 44 and each finger extension 51 includes a retaining corner 45 that are useful for securing the shielding strip 40 to a retention clip 46.

Figure 17:
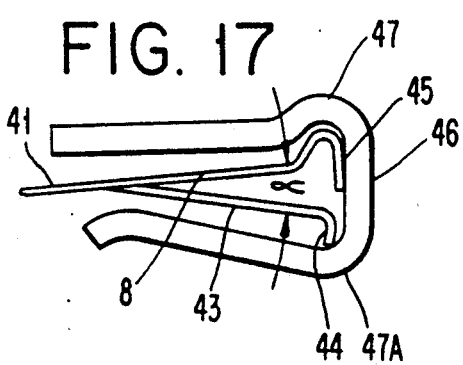
FIG. 17 is a side cross-sectional view of a portion of a shielding strip of a third embodiment as positioned in a retention clip.

When secured in a retention clip 46, the flexible tab 43 of each finger 41 becomes deflected upwardly such that the angle between the tab 43 and the tongue portion 8 is an angle $\alpha$ that is less than the free position angle $\theta$ (See FIG. 17). The resulting biased condition of the finger extensions 51 and the flexible tab 43 causes the retaining corner 45 of each finger extension 51 to be received in the retention receptacle 47 of the retention clip 46 while the corner projection 44 of each flexible tab 43 is caused to engage a lower corner 47A of the retention clip 46. In this manner, the shielding strip is secured to the retention clip 46 to form a single assembly while yet remaining unmounted on a surface 23.

Figure 16:
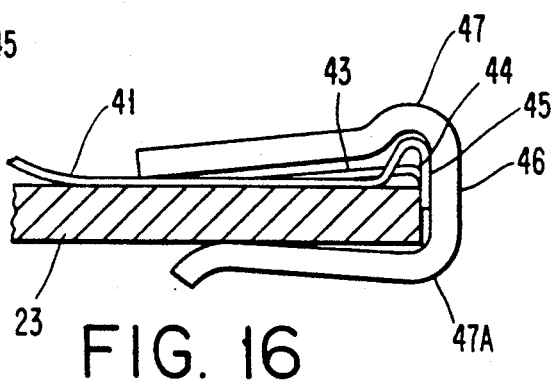
FIG. 16 is a side cross-sectional view of a portion of a shielding strip of a third embodiment of the present invention as mounted on a surface by a retention clip.

When the electromagnetic shielding device is mounted on a surface 23, the flexible tab 43 is deflected upward to a position substantially planar with each of the finger extension 51 (See FIG. 16). Further, when inserted completely, the surface 23 is in contact with the retaining corner 45 of each extension finger 51. In this manner, the electromagnetic shielding device is mounted on the surface 23 yet, since no separate fasteners are used, the device may be readily removed by simply withdrawing the surface 23 from the clip 46.

Figure 18:
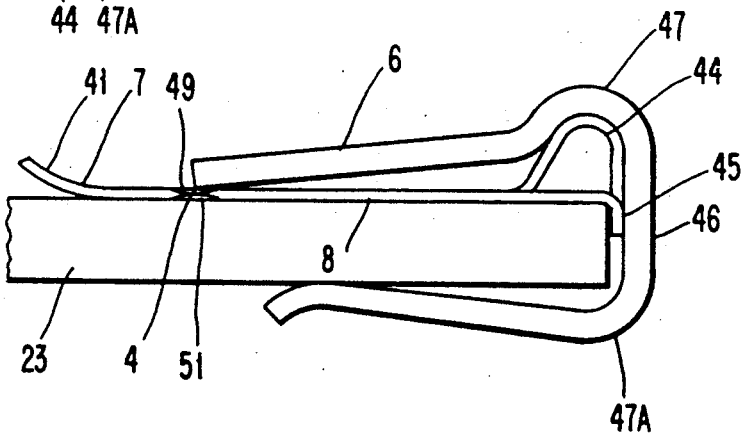
FIG. 18 indicates a stress condition of a portion of a shielding strip of a third embodiment of the present invention when mounted on a surface.
Figure 19:
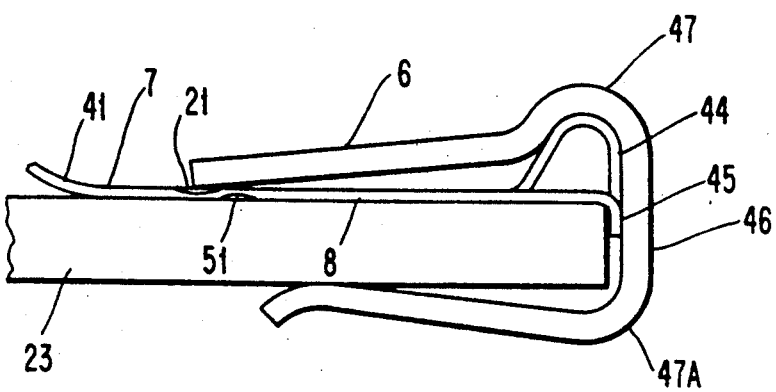
FIG. 19 indicates a stress condition of a portion of a third embodiment of the present invention when mounted on a surface and compressed to an operating portion.

With the third embodiment, the potential single stress region occurrence described with respect to the first and second embodiments is avoided as herein discussed with respect to FIGS. 18 and 19. When the finger 41 of the third embodiment is placed in a working position as previously discussed with respect to the first and second embodiments, substantially zero stress exists at the area joining the transition segment 7 and the tongue portion 8 of the finger 41 (See FIG. 6C). However, due to the upward deflection of the flexible strip 43 when mounted on a surface 23, a tab compressive stress will be induced at a top surface region 49 and a tab tensile stress will be induced at a bottom surface region 51 (See FIG. 18). Both regions are located at an area where the flexible tab 43 is joined to the finger 41.

When the finger 41 is compressed between two mating surfaces to the maximum compression position (See FIG. 6D), a tensile stress at the region 21 between the transition segment 7 and the tongue portion 8 will be induced such that the tab compressive stress at the top side region 49 will be eliminated. Consequently, any remaining stress in the finger area will include only the tensile stress at region 21 and the tab tensile stress of the flexible tab 43 at the bottom surface region 51. Since the remaining stress includes only these two tensile stresses, any cumulative stress that may arise due to, for example, improper positioning of the retention clip 46 as previously discussed, will be resultingly low. In this manner, the undesirably high additive stress region that may arise with the first and second embodiments is avoided.

Figure 20:
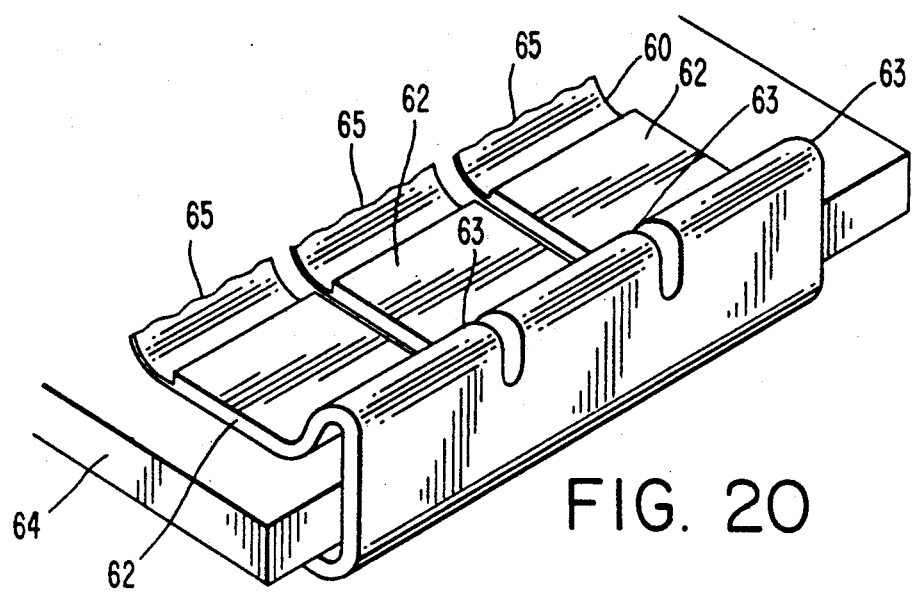
FIG. 20 shows a perspective view of a fourth embodiment of an electromagnetic shielding device of the present invention.

In order to provide a retention clip that is more readily flexible in the longitudinal direction, a fourth embodiment of the present invention is proposed (See FIG. 20). A fourth embodiment of a electromagnetic shielding device of the present invention includes a retention strip 61 having a plurality of finger segments 62 separated by a space 63. Each finger segment 62 corresponds to fingers 65 of a shielding strip 60 as mounted on a surface 64.

Additional embodiments of an electromagnetic shielding device in accordance with the present invention are shown in FIGS. 21-24. Such embodiments suggest incorporating the shielding strip into the retention clip so as to form a single member and avoid the need to assemble the shielding strip to a clip prior to mounting to a desired surface.

Figure 21:
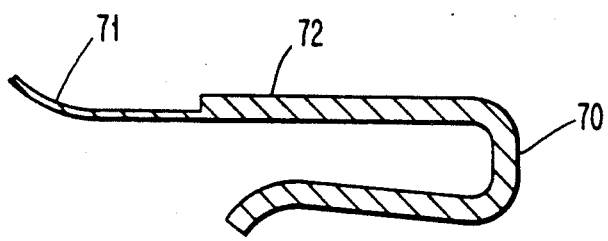
FIG. 21 shows a partial side view of a fifth embodiment of an electromagnetic shielding device of the present invention.

A fifth embodiment of the present invention includes an electromagnetic shielding device 70 that has a retention clip segment 72 integral with a shielding strip segment 71 (See FIG. 21). The thickness of the retention clip segment 72 is approximately four times the thickness of the shielding strip segment 71.

Figure 22:
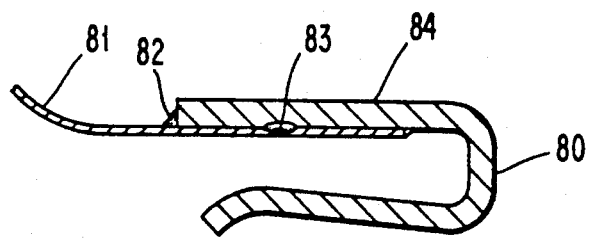
FIG. 22 shows a partial side view of a sixth embodiment of an electromagnetic shielding device of the present invention.

A sixth embodiment includes an electromagnetic shielding device 80 having a retention clip segment 84 and a shielding strip segment 81 (See FIG. 22). The shielding strip segment 81 is attached to an underside surface of the retention clip segment 84 by a plurality of welds 82, 83. A variety of welds may be used according to design factors.

Figure 23:
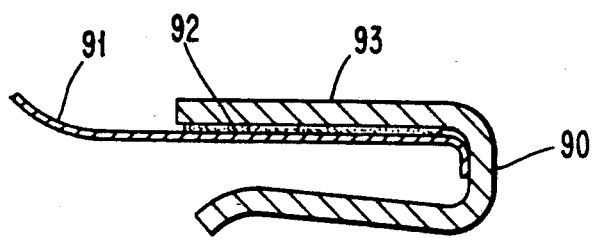
FIG. 23 shows a partial side view of a seventh embodiment of an electromagnetic shielding device of the present invention.

A seventh embodiment includes a electromagnetic shielding device 90 as having a retention clip segment 93 and a shielding strip segment 91 (See FIG. 23). The shielding strip segment 91 is fixed to an underside surface of the retention clip segment 93 by an adhesive 92.

Figure 24:
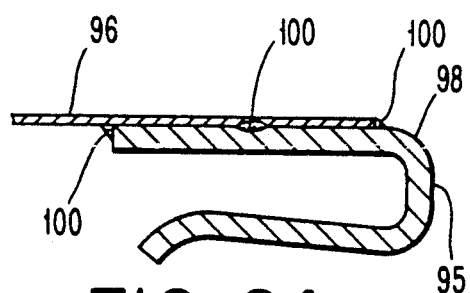
FIG. 24 shows a partial side view of an eighth embodiment of an electromagnetic shielding device of the present invention.

An eighth embodiment includes a electromagnetic shielding device 95 having a retention clip segment 98 and a shielding strip segment 96 (See FIG. 24). The shielding strip segment 96 is attached to a top side surface of the retention clip segment 98 by either resistance or fillet welds 100.

Figure 25:
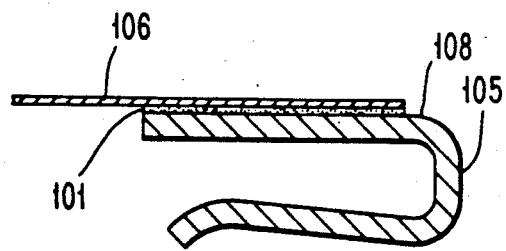
FIG. 25 shows a partial side view of a ninth embodiment of an electromagnetic shielding device of the present invention.

A ninth embodiment includes an electromagnetic shielding device 105 having a retention clip segment 108 and a shielding strip segment 106 (See FIG. 25). The shielding strip segment 106 is attached to a top side surface of the retention clip segment 108 by a soldered or brazed joint 101.

The principles, a preferred embodiment and mode of operation of the present invention have been described in the foregoing specification. However, the invention which is intended to be protected is not to be construed as limited to the particular embodiments disclosed. The embodiments are therefore to be regarded as illustrative rather than restrictive. Variations, equivalents and changes maybe made by others without departing from the spirit of the present invention. Accordingly, it is expressly intended that all such equivalents, variations, and changes which fall within the spirit and scope of the present invention as defined in the claims be embraced thereby.

What is claimed is:

1. An electromagnetic shielding device comprising:
   an electrically conductive shielding strip having a plurality of longitudinally arranged segments integrally connected by a carrier strip which extends along the longitudinal length of said shielding strip;
   means for clamping said shielding strip in a prestressed condition to a surface of a member intended for shielding such that an overall stress in said shielding strip is low during compression of said shielding strip between said surface intended for shielding and a mating surface; and
   means for securing said shielding strip to said means for clamping when said electromagnetic shielding device is unmounted on said surface.

2. An electromagnetic shielding device according to claim 1, wherein said means for securing includes a finger portion of each of said segments fixed to an underside surface of an extension of said means for clamping by at least one weld.

3. An electromagnetic shielding device according to claim 1, wherein said means for securing includes a finger portion of each of said segments fixed to an underside surface of an extension of said means for clamping by an adhesive.

4. An electromagnetic shielding device according to claim 1, wherein said means for securing includes a finger portion of each of said segments fixed to a topside surface of an extension of said means for clamping by at least one weld.

5. An electromagnetic shielding device according to claim 1, wherein said means for securing includes a finger portion of each of said segments fixed to a topside surface of an extension of said means for clamping by solder.

6. An electromagnetic shielding device according to claim 1, wherein said means for securing includes a finger portion being integral with a top surface of an extension of said means for clamping such that a thickness of said finger portion and said extension is at least four times thicker than a thickness of said electromagnetic shielding strip.

7. An electromagnetic shielding device comprising:
   an electrically conductive shielding strip having a plurality of longitudinally arranged segments integrally conducted by a carrier strip which extends along the longitudinal length of said shielding strip;
   means for clamping said shielding strip to a surface of a member intended for shielding; and
   means for securing said shielding strip to said means for clamping when said electromagnetic shielding device is unmounted on said surface, said means for securing including a flexible tab disposed on each of said segments and a retention receptable disposed on said means for clamping to engage an end portion of said flexible tab in order to secure said shielding strip to said means for clamping.

8. An electromagnetic shielding device according to claim 7, wherein said flexible tab of each of said segments is formed to extend in an upward direction at an angle from a tongue portion of each of said segments when said tab is in a free position.

9. An electromagnetic shielding device according to claim 8, wherein said retention receptacle is a slot positioned for receiving a corner projection of said flexible tab, said slot being positioned on an upper extension of said means for clamping.

10. An electromagnetic shielding device according to claim 8, wherein said flexible tab extends upward at an angle such that said electrically conductive shielding strip is substantially restrained from longitudinal movement relative to said means for clamping when said shielding strip is secured to said means for clamping.

11. An electromagnetic shielding device according to claim 7, wherein said flexible tab of each of said segments is formed to extend in a downward direction at an angle from a tongue portion of each of said segments when said tab is in a free position.

12. An electromagnetic shielding device according to claim 11, wherein said flexible tab extends downward at an angle such that said electrically conductive shielding strip is substantially restrained from longitudinal movement relative to said means for clamping when said shielding strip is secured to said means for clamping.

13. An electromagnetic shielding device according to claim 11, wherein said retention receptacle is a lower corner positioned for receiving a corner projection of said flexible tab.

14. A method of placing an electromagnetic shielding device into an operating position comprising the steps of:

inserting a tongue portion of a shielding strip into a clamping means such that said shielding strip is secured to said clamping means in an unmounted condition;

mounting said shielding strip to a surface intended for shielding with said clamping means such that a stress is induced in said shielding strip and said shielding strip is thus mounted in a pre-stressed condition; and compressing said shielding strip between said surface and a mating surface such that said shielding strip is oriented out of said pre-stressed condition and oriented into a working position wherein said stress ia reduced substantially to zero.

15. A method of placing an electromagnetic shielding device into an operating position according to claim 14, further including the step of compressing said shielding strip between said surface and said mating surface to a maximum compression position wherein an overall low stress is induced in said shielding strip.

16. A method of placing an electromagnetic shielding device into an operating position according to claim 15, wherein said step of compressing said shielding strip to a maximum compression position is limited to compressing said shielding strip until said mating surface contacts an outer surface of said means for clamping.

* * * * *